US007282693B2

(12) United States Patent
Onodera et al.

(10) Patent No.: US 7,282,693 B2
(45) Date of Patent: Oct. 16, 2007

(54) CAMERA MODULE FOR COMPACT ELECTRONIC EQUIPMENTS

(75) Inventors: Masanori Onodera, Kawasaki (JP); Susumu Moriya, Kawasaki (JP); Izumi Kobayashi, Kawasaki (JP); Hiroshi Aoki, Kawasaki (JP); Toshiyuki Honda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/710,500

(22) Filed: Feb. 26, 2007

(65) Prior Publication Data

US 2007/0164199 A1     Jul. 19, 2007

Related U.S. Application Data

(62) Division of application No. 10/634,752, filed on Aug. 6, 2003, now Pat. No. 7,202,460.

(30) Foreign Application Priority Data

Sep. 10, 2002 (JP) ............... 2002-264260

(51) Int. Cl.
*H01L 27/00* (2006.01)
*H01L 31/00* (2006.01)
(52) U.S. Cl. ............... 250/214.1; 250/208.1; 438/106; 257/692
(58) Field of Classification Search ............ 250/214.1, 250/208.1; 438/106, 110, 112, 125–127; 257/687, 690, 692, 778, 784, 787
See application file for complete search history.

(56) References Cited

U.S. PATENT DOCUMENTS

| | | | |
|---|---|---|---|
| 5,355,283 A | 10/1994 | Tadashi et al. | |
| 6,072,239 A | 6/2000 | Yoneda et al. | |
| 6,159,770 A | 12/2000 | Tetaka et al. | |
| 6,329,711 B1 | 12/2001 | Kawahara et al. | |
| 6,376,921 B1 | 4/2002 | Yoneda et al. | |

(Continued)

FOREIGN PATENT DOCUMENTS

CN     1152797 A     6/1997

(Continued)

OTHER PUBLICATIONS

European Search Report dated Jul. 28, 2004.

(Continued)

*Primary Examiner*—Kevin Pyo
(74) *Attorney, Agent, or Firm*—Westerman, Hattori, Daniels & Adrian, LLP.

(57) ABSTRACT

In a camera module of a so-called multi-chip type, an imaging device and a semiconductor element for processing are mounted. The semiconductor element is encapsulated by a mold resin. Protruding parts are formed by the mold resin on a mounting surface of the mold resin. A metal film forming a pattern wiring is formed on the mounting surface of the mold resin. The metal film is also formed on the protruding parts so as to constitute external connection terminals together with the protruding parts. Electrodes of the semiconductor element are electrically connected to the pattern wiring. The protruding parts include first protruding parts positioned around the semiconductor element and second protruding parts formed in a mounting area of the semiconductor element on the mounting surface.

4 Claims, 15 Drawing Sheets

U.S. PATENT DOCUMENTS

| | | |
|---|---|---|
| 6,573,121 B2 | 6/2003 | Yoneda et al. |
| 7,202,460 B2 * | 4/2007 | Onodera et al. ......... 250/208.1 |
| 2002/0027265 A1 | 3/2002 | Yoneda et al. |
| 2002/0057468 A1 | 5/2002 | Segawa et al. |
| 2004/0046240 A1 * | 3/2004 | Hasebe et al. .............. 257/678 |

FOREIGN PATENT DOCUMENTS

| | | |
|---|---|---|
| CN | 96114520 A | 6/1997 |
| EP | 1 091 401 A2 | 4/2001 |
| EP | 1 237 202 A2 | 9/2002 |
| JP | 4-171970 | 6/1992 |
| JP | 9-162348 | 6/1997 |
| JP | 11-163204 A | 6/1999 |
| JP | 2000-209474 | 7/2000 |
| JP | 2001-16486 | 1/2001 |
| JP | 2002-264260 | 9/2002 |

OTHER PUBLICATIONS

Office Action from the State Intellectual Property Office of the People's Republic of China, dated Jan. 20, 2006, issued in corresponding Chinese Application No. 03158049.1 and English language Translation.

* cited by examiner

CAMERA MODULE FOR COMPACT ELECTRONIC EQUIPMENTS

CROSS REFERENCE TO RELATED APPLICATION

This application is a divisional application of U.S. Ser. No. 10/634,752, filed Aug. 6, 2003 now U.S. Pat. No. 7,202,460.

BACKGROUND OF THE INVENTION

1. Field of the Invention

The present invention relates to semiconductor devices and, more particularly, to a semiconductor device suitable for a camera module which integrally packages a light-receiving element and an image-pickup lens.

2. Description of the Related Art

In recent years, portable telephones and portable personal computers equipped with a small camera have been developed. For example, a portable telephone equipped with a small camera picks up an image of a calling person by the small camera so as to acquire image data and sends the image data to a person on the line. Generally, such a small camera is constituted by a CMOS sensor and a lens.

Miniaturization of portable telephones and portable personal computers has been progressed further, and there is also a demand for miniaturization of small cameras used for these equipments. In order to satisfy the demand for miniaturization of such a small camera, a camera module which integrates a lens and a CMOS sensor has been developed.

The above-mentioned camera module is formed as a small module by incorporating an image-pickup lens, an imaging device and a semiconductor element into a mold resin. The camera module has the same structure as a semiconductor device which has a semiconductor element encapsulated in a mold resin, and is connectable to a circuit board by using bump-chip-carrier (BCC) electrodes as external connection terminals. As an example of a BCC electrode, there is an electrode formed of a protrusion made of a mold resin and covered with a metal film on an outer surface of the protrusion. Such a BCC electrode is generally referred to as a resin bump.

FIG. 1 is a cross-sectional view showing an example of a semiconductor device having a resin bump. FIG. 2 is a cross-sectional view showing another example of the semiconductor device having a resin bump.

The semiconductor device shown in FIG. 1 has a semiconductor element 1 encapsulated by a mold resin 2. A metal film 3 is formed on the bottom (mounting side) of the mold resin 2. The metal film 3 is patternized so as to form circuit patterns. The semiconductor element 1 is arranged within a mold resin 2 in a face-up state where a circuit formation surface faces upward, and an element-fixing resin 4 is provided on the backside of the semiconductor element 1. The element-fixing resin 4 is an adhesive used for fixing the semiconductor element 1 onto the circuit board in the manufacturing process. Electrodes of the semiconductor element 1 are connected to the metal film 3 (pattern wiring) by bonding wires 5.

The resin bump 6 is formed on the bottom (mounting side) of resin mold 2. The resin bump 6 is formed by forming a protruding part made of the mold resin and forming the metal film 3 on the protruding part. The metal film 3 positioned at the end of the protruding part serves as an external connection electrode. Such a resin bump can be formed by forming on a base board a recess corresponding to the protruding part, forming a resin bump using the recess and thereafter removing the base board.

FIG. 2 shows the semiconductor device shown in FIG. 1 in which the semiconductor element 1 is arranged in a face-down state where the circuit formation surface faces downward. Protruding electrodes are formed on the semiconductor element 1, and the protruding electrodes are connected to the circuit patterns formed by the metal film 3. The circuit formation surface of the semiconductor element 1 is filled up with an under-fill material 7. The resin bumps 6 are formed on the bottom (mounting side) of the mold resin 2 similar to the semiconductor device shown in FIG. 1.

The structure of the semiconductor device having resin bumps as shown in FIGS. 1 and 2 is preferably used for producing a small camera module.

As a structure of the camera module which can be miniaturized, there is suggested a camera module in which a resin mold provided with a through opening for receiving light and wiring pattern is connected to a circuit board having a through hole, an imaging device being flip-chip mounted on one surface of the resin mold and a lens holder for image formation is mounted on the other surface in a state where the lens holder covers a space above a light-receiving part. The imaging device detects a light at the light-receiving part or a device surface on which a micro lens is present and apply a photoelectric transformation to the detected light, and provides the thus-obtained image signal to a signal processing circuit, etc. so as to display a picture on a screen of a display device or the like.

FIG. 3 is a cross-sectional view of a camera module using the structure of the semiconductor device shown in FIG. 1. FIG. 4 is a cross-sectional view of a camera module using the structure of the semiconductor device shown in FIG. 2.

The camera module shown in FIG. 3 has an image-pickup lens 11 attached to a lens holder 10. The lens holder 10 is mounted on the upper surface of a molded body 12 (corresponding to the mold resin 2 of FIG. 1), and an imaging device 13 is attached to the undersurface of the molded body 12. Provided inside the molded body 12 is a semiconductor element 14 (corresponding to the semiconductor element 1 of FIG. 1). Electrodes of the semiconductor element 14 are connected to the pattern wiring which consists of a metal film 15 formed on the bottom (mounting side) of the molded body 12 by the bonding wires.

Resin bumps 16 are formed on the bottom of the molded body 12, and are electrically connected to the electrodes of the semiconductor element 14 and the imaging device element 13 through the pattern wiring which consists of the metal film 15. Additionally, the resin bumps 16 are connected to the pattern wiring 18 of the wiring board 17. The wiring board 17 is a flexible board, and is provided with a pattern wiring made of a copper foil or the like on a polyimide substrate 19. The camera module is connected to an external circuit through the wiring board 17.

In the camera module of the above-mentioned structure, a light passed through the lens 10 passes a filter glass 20 and is incident on the imaging surface of the imaging device 13. Thereby, an electric signal corresponding to the image on the imaging surface is output from the imaging device 13. The semiconductor element 14 applies image processing to the electric signal from the imaging device 13, and outputs the processed signal to the wiring board 17 through the resin bumps 16. Thus, the imaging device 13 and the semiconductor element 14 are efficiently connected to the wiring board 17 by the resin bumps 16 formed using the resin of the molded body 12.

FIG. 4 shows a structure in which the semiconductor element 14 is arranged in a face-down state where the circuit formation surface faces downward in the camera module shown in FIG. 3. Projection electrodes are formed on the semiconductor element 14 and are joined to the circuit pattern formed by the metal film 15.

It should be noted that Japanese Laid-Open Patent Application No. 9-162348 may provide a background of the present invention.

The semiconductor devices shown in FIGS. 1 and 2 have the structures in which the resin bumps 6 are arranged around the semiconductor element 1. Thus, if the semiconductor element becomes large and a number of electrodes is increased, there is a problem in that the size of the semiconductor device itself becomes large.

The above-mentioned problem also occurs in the camera modules shown in FIGS. 3 and 4. That is, when the semiconductor element 14 (for example, a processing element) is mounted in addition to the imaging device 13, it is preferable, in order to attempt miniaturization of the module, to take a structure in which the semiconductor element 14 is embedded in the encapsulation resin that forms the molded body 12 unlike the externally attached imaging device. However, it is a subject to miniaturize a module while using the resin bump since the module size becomes inevitably large when forming the resin bumps with the encapsulation resin.

SUMMARY OF THE INVENTION

It is a general object of the present invention to provide an improved and useful semiconductor device in which the above-mentioned problems are eliminated.

A more specific object of the present invention is to provide a miniaturized semiconductor device having resin bumps which is formed by effectively using an area in the bottom (mounting side) of the semiconductor device.

Another object of the present invention is to miniaturize a camera module having a so-called multi-chip type in which an imaging device and a processor element are mounted.

In order to achieve the above-mentioned objects, there is provided according to one aspect of the present invention a semiconductor device comprising: a semiconductor element; a mold resin encapsulating the semiconductor element; protruding parts protrudingly formed by the mold resin on a mounting surface of the mold resin; and a metal film forming a pattern wiring on the mounting surface of the mold resin, the metal film also formed on the protruding parts so as to constitute external connection terminals together with the protruding parts, wherein electrodes of the semiconductor element are electrically connected to the pattern wiring; and the protruding parts include first protruding parts positioned around the semiconductor element and second protruding parts formed in a mounting area of the semiconductor element on the mounting surface.

According to above-mentioned invention, so-called resin bumps are formed on the mounting surface of the semiconductor device. The resin bumps constituted by the second protruding parts among the resin bumps are formed in the area where no bumps are formed in a conventional semiconductor device, that is, the area directly under the semiconductor element. Thereby, in the semiconductor device according to the present invention, the resin bumps can be formed all over the entire mounting surface. Therefore, if the semiconductor device according to the present invention has the same size, a number of resin bumps can be increased as compared to the conventional semiconductor device. If, in other words, the resin bumps of the same number as the conventional semiconductor device are formed, the size of the semiconductor device can be reduced, thereby achieving a miniaturized semiconductor device. Additionally, since the resin bumps are also provided in the element mounting area, the degree of freedom in arrangement of the pattern wiring is increased which results in efficient wiring.

In the above-mentioned semiconductor device, a resin different from the mold resin may be provided between the mounting surface and the semiconductor element so that the second protruding parts are formed by the resin different from the mold resin. The electrode of the semiconductor element may be connected to the pattern wiring by a metal wire, and the resin different from the mold resin may serve as a resin for fixing the semiconductor element. Further, the electrodes of the semiconductor element may be protruding electrodes, the semiconductor element being flip-chip mounted to the pattern wiring, and the resin different from the mold resin is an under-fill material.

In the semiconductor device according to the present invention, the first protruding parts and the second protruding parts may be arranged in a grid pattern on substantially all over the mounting surface.

Additionally, there is provided according to another aspect of the present invention a camera module comprising: a lens holder carrying an image-pickup lens; a molded body to which the lens holder is attached; protruding parts formed on a mounting surface of the molded body; a metal film, formed on the protruding parts, forming a pattern wiring on the mounting surface of the molded body so as to constitute external connection terminals together with the protruding parts; a semiconductor element embedded in the molded body; an imaging device mounted on the mounting surface of the molded body and having an imaging surface facing the image-pickup lens through an opening of the molded body; and a wiring board to which the molded body is mounted, wherein the electrodes of the semiconductor element are electrically connected to the pattern wiring, and the protruding parts include first protruding parts located around the semiconductor element and second protruding parts formed on the mounting surface of the semiconductor element within a mounting area.

According to the above-mentioned invention, a space for providing the wiring pattern can be attained since the resin bumps are also arranged directly under the semiconductor element. Thus, high-density wiring can be achieved, which results in miniaturization of a camera module.

In the camera module according to the present invention, a resin different from the mold resin may be provided between the mounting surface and the semiconductor element, and the second protruding parts may be formed of the different resin. The electrodes of the semiconductor element may be connected to the pattern wiring by metal wires, and the different resin may serve as a resin for fixing the semiconductor element. The electrodes of the semiconductor element may be protruding electrodes, the semiconductor element may be flip-chip connected to the pattern wiring, and the different resin may be an under-fill material. The second protruding parts may also be formed in the vicinity of an element mounting area on the mounting surface of the molded body. The second protruding parts formed in the vicinity of the element mounting area may be arranged in the vicinity of a center of each side of the element mounting area.

Additionally, the first protruding parts may include dummy protruding parts arranged in the vicinity of a periphery of the semiconductor element, and the metal film formed on the dummy protruding parts may be isolated from the wiring pattern. The dummy protruding parts may be arranged in the vicinity of each corner of the element mounting area. Further, a part of the imaging device and a part of the semiconductor element may be arranged in an overlapping state with each other.

Additionally, there is provided according to another aspect of the present invention a manufacturing method of a semiconductor device comprising the steps of: forming recessed parts in an area including an element mounting area in a mounting surface of a lead frame; forming a metal film on the mounting surface and inside the recessed parts of the lead frame; filling the recessed part formed in the element mounting area with an insulating resin; mounting a semiconductor element in the element mounting area of the lead frame; encapsulating the semiconductor element with a resin on the lead frame; and removing the lead frame.

Further, there is provided according to another aspect of the present invention a manufacturing method of a camera module, comprising the steps of: forming recessed parts in an area including an element mounting area on a mounting surface of a lead frame; forming a metal film on the mounting surface of the lead frame and inside the recessed parts; filling inside the recessed parts formed in the element mounting area with an insulating resin; mounting a semiconductor device in the element mounting area of the lead frame; encapsulating the semiconductor element with a mold resin on the lead frame; filling with the mold resin inside the recessed parts formed in an area other than the element mounting area; removing the lead frame from the molded body; flip-chip mounting an imaging device onto the metal film exposed on the mounting surface of the molded body; mounting the molded body to a wiring board by using the metal film which is formed on protruding parts formed by the insulating resin filled in the recessed parts and the mold resin; and mounting a lens holder provided with an image-pickup lens to the molded body.

In the above-mentioned manufacturing method of a camera module, the insulating resin may be for fixing the semiconductor element, and the step of mounting the semiconductor element may include a step of wire-bonding electrodes of the semiconductor element to the metal film. Additionally, the insulating resin may be an under-fill material, and the step of mounting the semiconductor element may include a step of flip-chip bonding electrodes of the semiconductor element to the metal film.

Other objects, features and advantages of the present invention will become more apparent from the following detailed description when read in conjunction with the accompanying drawings.

DETAILED DESCRIPTION OF THE PREFERRED EMBODIMENTS

Figure 1:
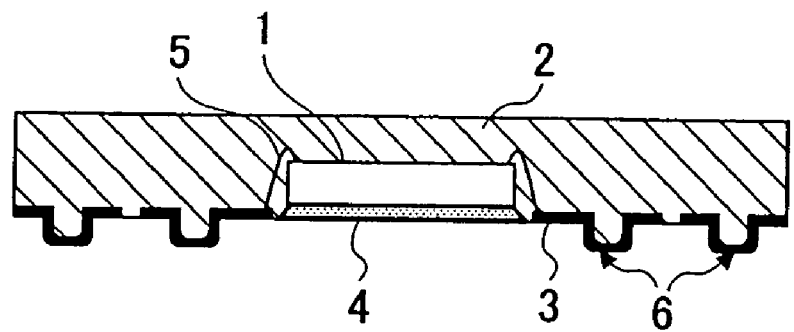
FIG. 1 is a cross-sectional view showing an example of a semiconductor device having resin bumps.
Figure 5:
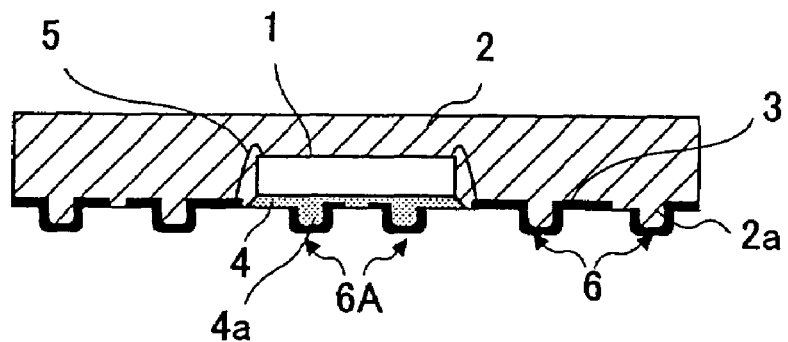
FIG. 5 is a cross-sectional view showing a semiconductor device according to a first embodiment of the present invention.

A description will now be given, with reference to FIG. 5, of a first embodiment of the present invention. FIG. 5 is a cross-sectional view of a semiconductor device 30 according to the first embodiment of the present invention. In FIG. 5, parts that are the same as the parts shown in FIG. 1 are given the same reference numerals.

The semiconductor device 30 according to the first embodiment of the present invention has a semiconductor element encapsulated by a mold resin 2 with a metal film 3 formed on a bottom surface (mounting surface) of the mold resin 2. The metal film 3 is patternized so as to form a wiring pattern. The semiconductor element 1 is arranged in the mold resin 2 in a face-up state where a circuit forming surface faces upward, and an element fixing resin 4 is provided on the backside of the semiconductor element 1. The element fixing resin 4 is an adhesive for fixing the semiconductor element 1 to a substrate in a manufacturing process thereof. Electrodes of the semiconductor element 1 are connected to the metal film 3 (pattern wiring) by bonding wires 5.

Resin bumps 6 are formed in the bottom surface (mounting surface) of the mold resin 2. The resin bumps are constituted by forming protruding parts 2a (first protruding parts) by the mold resin 2 and then forming the metal film 3 on the protruding parts 2a so that the metal film 3 located on tops of the protruding parts 2 serve as external connection electrodes. Such resin bumps can be formed by forming recessed parts corresponding to the protruding parts on a board, forming the resin bumps by using the recessed parts, and, then removing the substrate. The forming method of the resin bumps will be explained later in the description of a manufacturing method of a camera module.

In addition to the resin bumps 6, the semiconductor device 30 has resin bumps 6A. The resin bumps 6A are provided in an area just under the semiconductor element 1. Since the element fixing resin 4 is filled in the area just under the semiconductor element 1, the resin bumps 6A have a structure where the metal film 3 is formed on protruding parts 4a (second protruding parts) formed by the element fixing resin 4. On the other hand, the resin bumps 6 have a structure where the metal film 3 is formed on the protruding parts 2a formed by the mold resin 2 as mentioned above.

Figure 6:
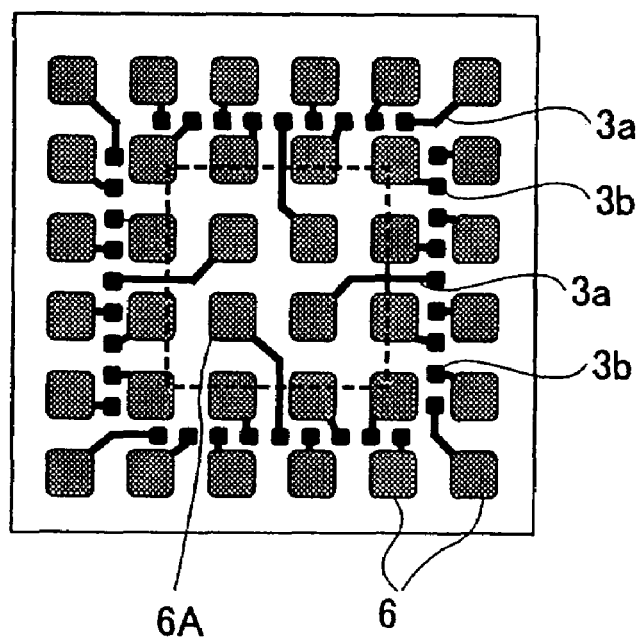
FIG. 6 is a bottom view of the semiconductor device shown in FIG. 5.

FIG. 6 is a bottom view of the semiconductor device 30 shown in FIG. 5. In FIG. 6, the area indicated by dotted lines is a semiconductor element mounting area, which corresponds to an area just under the semiconductor element 1. The resin bumps 6 and 6A are connected to bonding pads 3b formed by the metal film 3 by a pattern wiring 3a also formed by the metal film 3.

As mentioned above, in the present embodiment, the resin bumps 6 and the resin bumps 6A are formed on the bottom surface of the semiconductor device 30. Although the resin bumps 6A are formed in the area just under the semiconductor element where no bumps are formed conventionally, the resin bumps 6A are connected to the semiconductor element 1 through the pattern wiring 3a and the bonding pads 3b formed by the metal film 3. Thus, the resin bumps can be formed over the whole bottom surface of the semiconductor device 30.

Therefore, if the semiconductor device 30 according to the present embodiment has the same size as a conventional semiconductor device, a number of resin bumps can be increased. In other words, if the same number of resin bumps as a conventional semiconductor device, the size of the semiconductor device 30 can be reduced, which realizes a miniaturized semiconductor device. Additionally, the degree of freedom of arrangement of the pattern wiring is increased by the resin bumps 6A provided in the semiconductor element mounting area, which results in efficient wiring.

Figure 7:
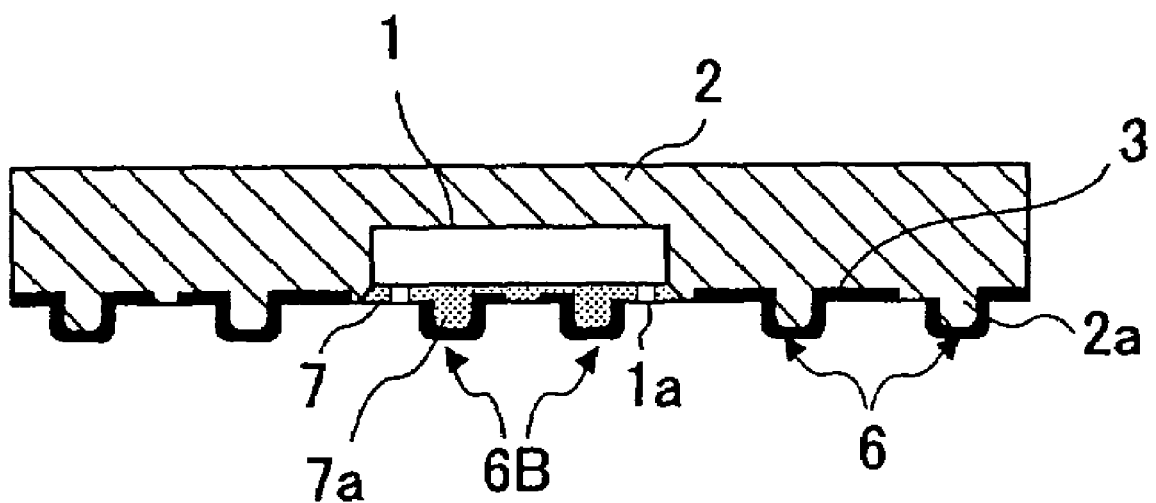
FIG. 7 is a cross-sectional view showing another example of the semiconductor device according to the first embodiment of the present invention.

FIG. 7 is a cross-sectional view of a semiconductor device 35 having a structure in which the semiconductor element 1 is arranged in the face-down state where the circuit forming surface faces downward in the semiconductor device 30 shown in FIG. 5. Protruding electrodes 1a are formed in the semiconductor element 1, and the protruding electrodes 1a are joined to the wiring pattern formed by the metal film 3. That is, although the semiconductor element 1 shown in FIG. 5 is connected by wire bonding, the semiconductor element 1 shown in FIG. 6 is connected by flip-chip bonding.

Figure 2:
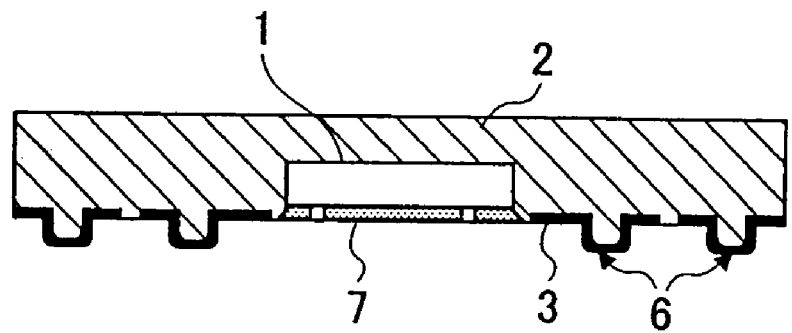
FIG. 2 is a cross-sectional view showing another example of a semiconductor device having resin bumps.

In the semiconductor device 35, the resin bumps 6 are formed on the bottom surface (mounting surface) of the mold resin 2 similar to the semiconductor device shown in FIG. 2. Although the area just under the semiconductor element 1 is filled up with the under-fill material 7, protruding parts 7a are formed by the under-fill material 7 like the semiconductor device 30 shown in FIG. 5. Additionally, the metal film 3 is formed on the protruding parts 7a so as to constitute the resin bumps 6B.

Although the resin bumps 6A are formed by the protruding parts 4a formed of the element fixing resin 4 in the semiconductor device 30, the resin bumps 6B are formed by the protruding parts 7a formed of the under-fill material 7 in the semiconductor device 35. Since each of the element fixing resins 4 and the under-fill material is formed of an insulating resin etc., the resin bumps 6A and 6B have a function the same as that of external connection terminals.

As mentioned above, since the resin bumps 6B of the semiconductor device 35 shown in FIG. 7 are formed in the area just under the semiconductor element 1 similar to the semiconductor device 30 shown in FIG. 5, the semiconductor device 35 shown in FIG. 7 contributes to the miniaturization of a semiconductor device similar to the semiconductor device 30.

Figure 3:
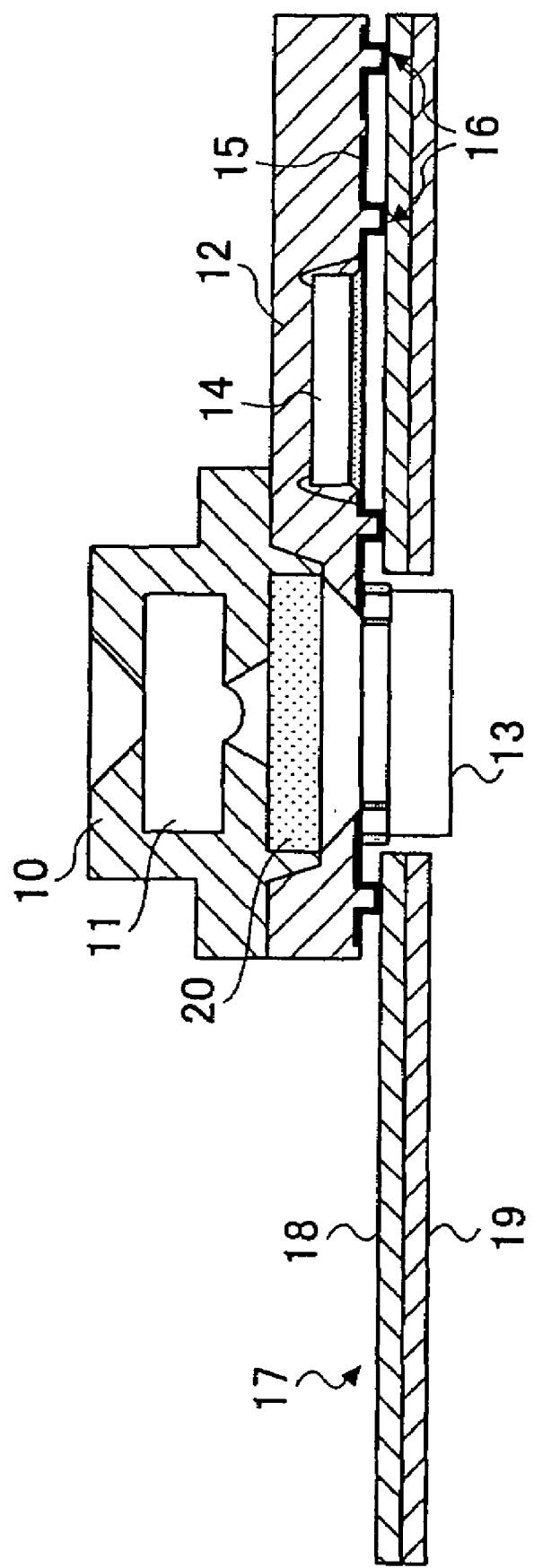
FIG. 3 is a cross-sectional view showing an example of a camera module having resin bumps.
Figure 4:
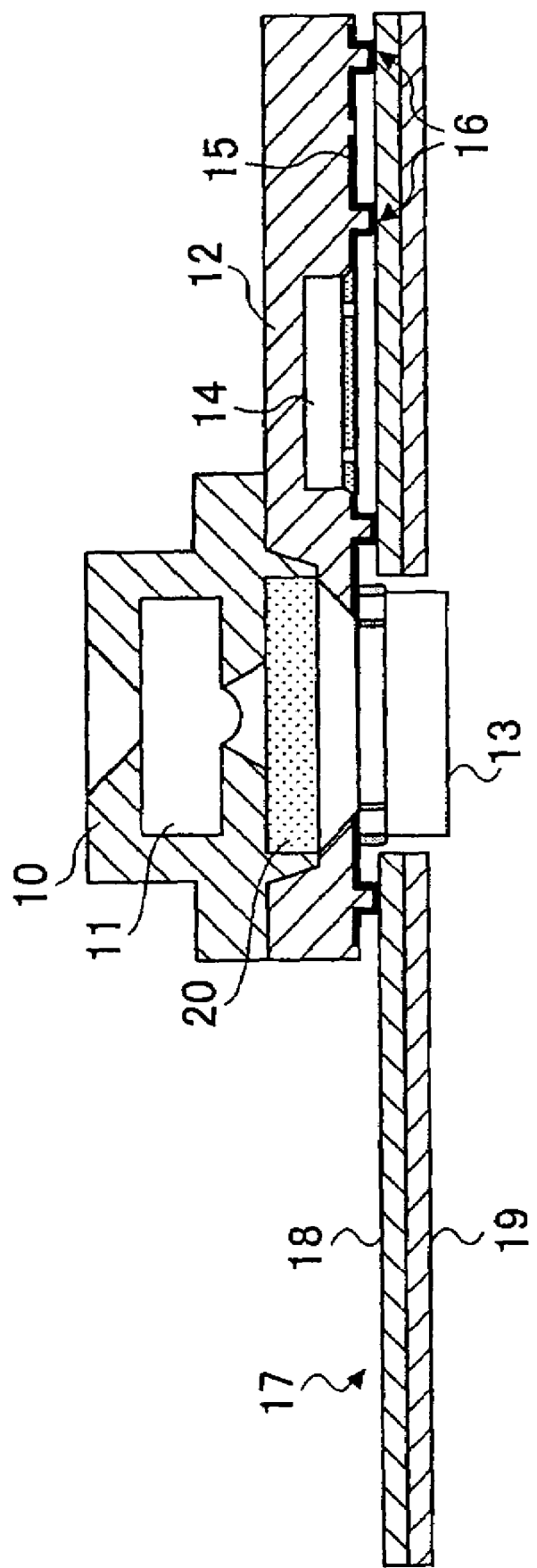
FIG. 4 is a cross-sectional view showing another example of a camera module having resin bumps.
Figure 8:
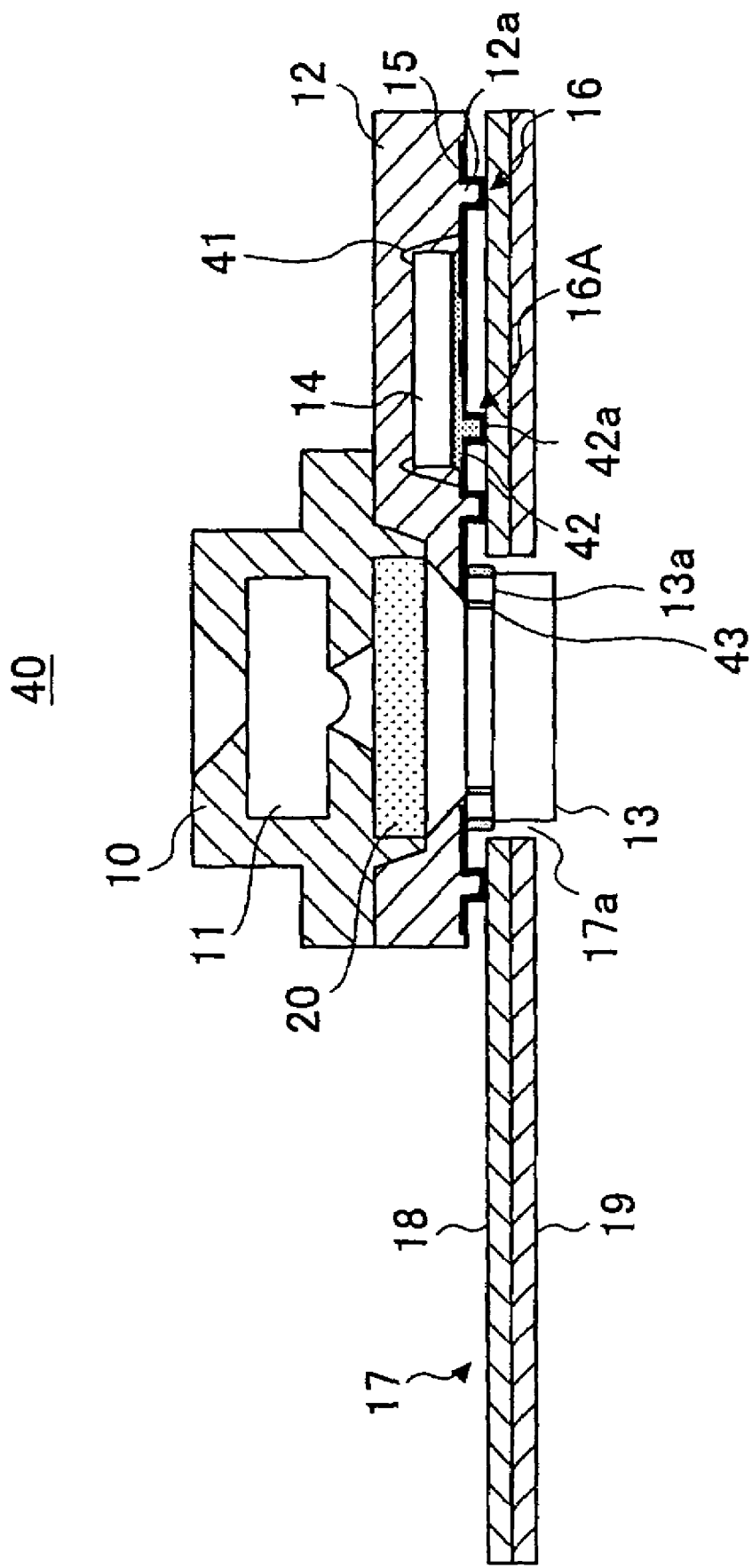
FIG. 8 is a cross-sectional view showing a camera module according of a second embodiment of the present invention.

Next, a description will be given, with reference to FIG. 8, of a camera module which is a semiconductor device according to a second embodiment of the present invention. FIG. 8 is a cross-sectional view of the camera module 40 according to the second embodiment of the present invention. In FIG. 8, parts that are the same as the parts shown in FIG. 3 are given the same reference numerals.

In the camera module 40 shown in FIG. 8, a lens holder 10 equipped with an image-pickup lens 11 is attached to an upper surface of the molded body 12, and an imaging device 13 is attached to a lower surface of the molded body 12. A semiconductor element 14 is arranged inside the molded body as a processor element. Electrodes of the semiconductor element 14 are connected by bonding wires 14 to the pattern wiring which is made by a metal film 15 formed on the bottom surface (mounting surface) of the molded body 12.

The resin bumps 16 as shown in the above-mentioned FIG. 5 are formed on the bottom surface of the molded body 12, and the resin bumps 16 are electrically connected to the semiconductor element 14 and the imaging device 13 through the pattern wiring which is formed by the metal film 15. Additionally, resin bumps 16A are formed in an area just under the semiconductor element 14 by utilizing protruding parts 42a formed of an element fixing resin 42. The resin bumps 16 and 16A are connected to the pattern wiring 18 of a wiring board 17.

The wiring board 17 is a flexible board, and is provided with a pattern wiring made of a copper foil etc. applied onto a board 19 made of a polyimide tape or the like. An opening 17a is formed in the wiring board and the imaging device has protruding electrodes 13a so that the imaging device 13 is mounted onto the bottom surface (mounting surface) of the molded body in a state where the imaging device 13 is situated within the opening 17a. An under-fill material 43 is filled between the imaging device 13 and the molded body 12. The camera module 40 is connected through the wiring board 17 to an external circuit of a portable equipment such as a portable telephone or a small computer.

In the camera module 40 of the above-mentioned structure, a light which passed through the lens 10 passes a filter glass 20 and is incident on the imaging surface of the imaging device 13, and thereby, an electric signal corresponding to an image is output from the imaging device 13. The semiconductor element 14 applied an image processing to the electric signal from the imaging device 13, and outputs the processed signal to the wiring board 17 through the resin bumps 16. Thus, the imaging device 13 and the semiconductor element 14 are efficiently connected to the wiring board 17 by the resin bumps 16 formed by the resin of the molded body 12 and the resin bumps 16A formed by the element fixing resin 42.

Figure 9:
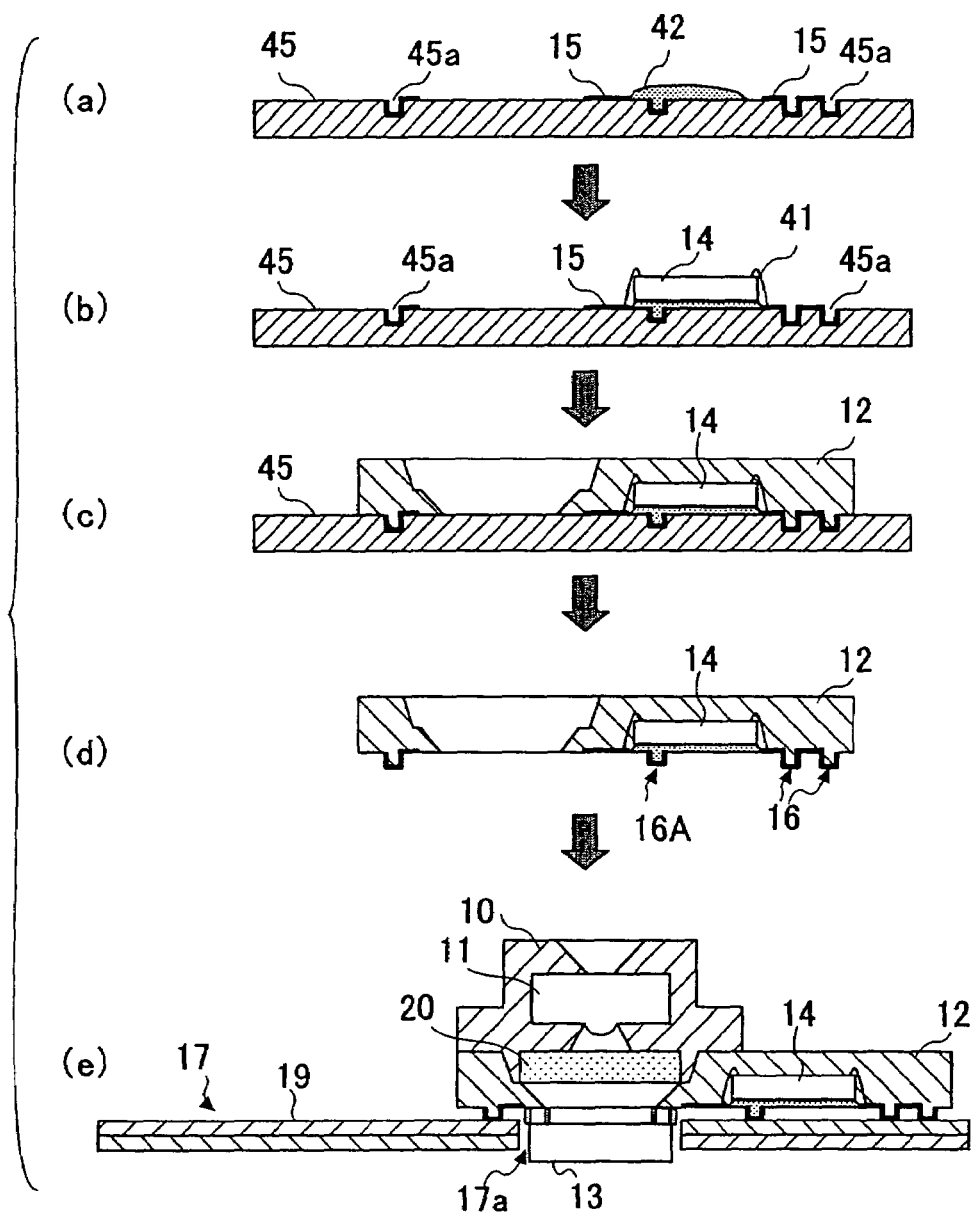
FIG. 9 is an illustration for explaining a manufacturing process of the camera module shown in FIG. 8.

Next, a description will be given, with reference to FIG. 9, of a manufacturing method of the camera module shown in FIG. 8. FIG. 9 is an illustration for explaining the manufacturing process of the camera module 40.

First, a lead frame 45 made of a copper plate or the like is prepared, and recessed parts 45a are formed on a surface of the lead frame 45 as shown in FIG. 9-(a). The recessed parts 45a are formed in a configuration and at positions corresponding to the resin bumps 16 and 16A formed on the bottom surface of the molded body 12. The metal film 15 is formed on the surface of the lead frame 45. The metal film 15 is patternized so as to be the pattern wiring and the bonding pads formed in an inner surface of the recessed parts 45a and the surface of the lead frame. Then, the element fixing resin 42 made of an insulating resin is applied in the element mounting area of the lead frame 45. During the application, the element fixing resin 42 is filled in the recessed parts 45a.

Next, as shown in FIG. 9-(b), the semiconductor element 14 is laid on the element fixing resin 42, and the element fixing resin 42 is cured. After the element fixing resin 42 is cured, the electrodes of the semiconductor element 14 are connected by the bonding wires 41 to the bonding pads formed by the metal film 15.

Then, as shown in FIG. 9-(c), the molded body 12 is formed by a mold resin in the board 45. At this time, the mold resin is filled in the recessed parts other than that formed in the element mounting area.

After the molded body 12 is formed, as shown in FIG. 9-(d), the lead frame 45 is removed from the molded body 12. The removal of the lead frame 45 is performed using an exfoliating method, a dissolving method using etching, etc.

Thereafter, as shown in FIG. 9-(e), the imaging device 13 is flip-chip bonded to the bonding pads formed by the metal film 15 exposed on the bottom surface (mounting surface) of the molded body 12. Then, the resin bumps 16 and 16A are connected to the pattern wiring 18 of the wiring board 17 in a state where the imaging device 13 is situated in the opening 17a of the wiring board 17. Subsequently, the lens holder 10 equipped with the lens 11 and filter glass 20 is attached to the molded body 12, which results in a completion of the camera module 40.

According to the above-mentioned camera modules 40, a space sufficient for providing the wiring pattern can be reserved since the resin bumps 16A are arranged also directly under the semiconductor element 14. Thereby, high-density wiring can be achieved, and, as a result, miniaturization of a camera module can be attained. Additionally, the element mounting on the resin bumps can be performed since the protruding parts 42a for the resin bumps are formed using the element fixing resin used as an adhesive of a semiconductor element.

When carrying out wire bonding, it is necessary to use an insulating resin as the element fixing resin since it is necessary to prevent short circuiting of metal wires during die-bonding. As for such an insulating resin, is it preferable to use a resin having a high-resistance to an etchant used for dissolving and removing a board and having high-adhesion with the metal film 15.

Figure 10:
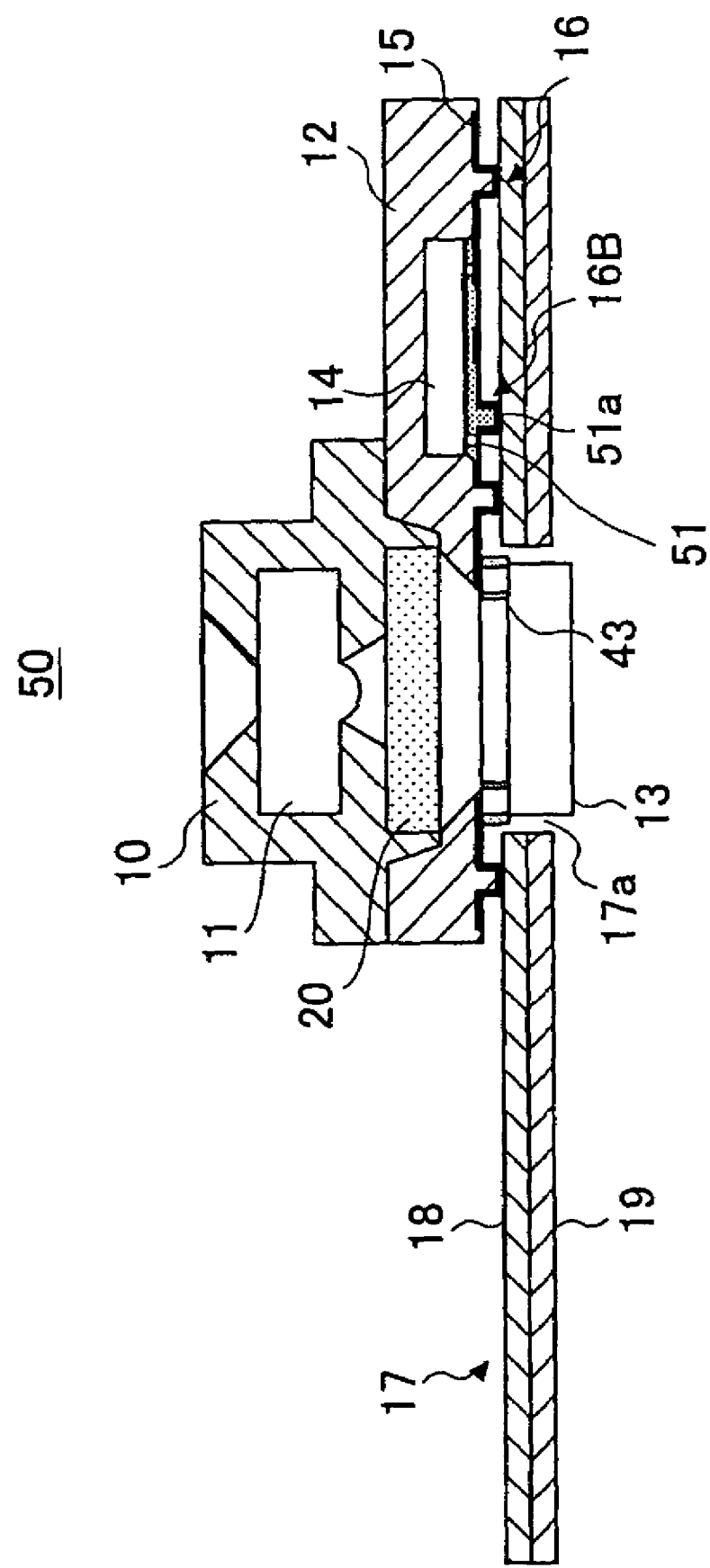
FIG. 10 is a cross-sectional view showing another example of the camera module according of the second embodiment of the present invention.

Although the semiconductor element 14 is connected by wire-bonding In the camera module shown in FIG. 8, the semiconductor element 14 can also be connected by flip-chip bonding. FIG. 10 is a cross-sectional view of a camera module which is constituted by flip-chip bonding the semiconductor element 14 of the camera module 40 shown in FIG. 8. In FIG. 10, parts that are the same as the parts shown in FIG. 8 are given the same reference numerals, and descriptions thereof will be omitted.

The camera module 50 shown in FIG. 10 is constituted by flip-chip mounting the semiconductor element 14 to the metal film 15 exposed on the bottom surface (mounting surface) of the molded body 12. An under-fill material 51 is provided under the semiconductor element 14 so that protruding parts 51a are formed by the under-fill material 51. The metal film 15 is formed on the outer surface of the protruding parts 51a so as to form the resin bumps 16B.

Figure 11:
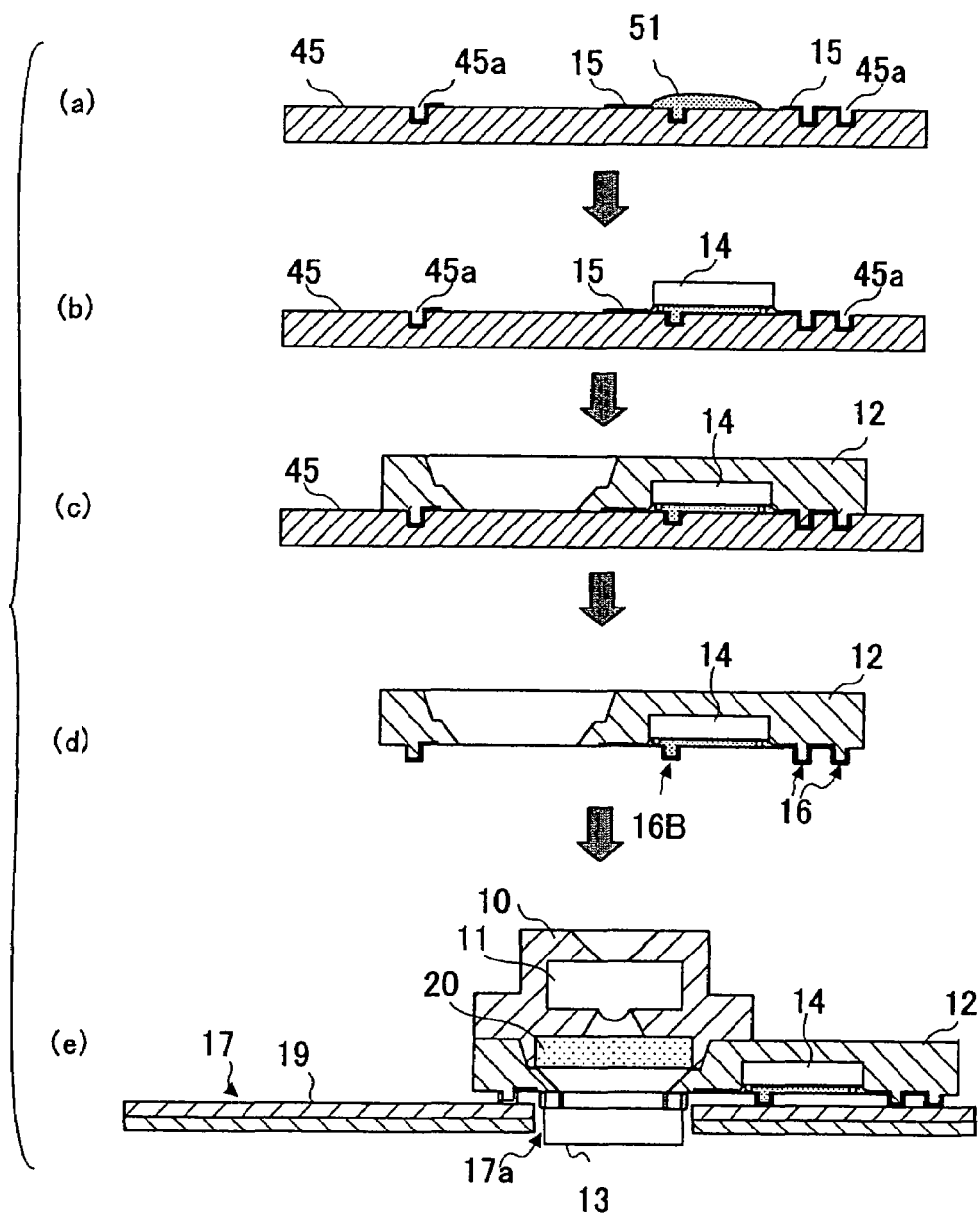
FIG. 11 is an illustration for explaining a manufacturing process of the camera module shown in FIG. 10.

FIG. 11 is an illustration for explaining a manufacturing method of the camera module 50 shown in FIG. 10. The manufacturing method of the camera module 50 is basically the same as the manufacturing method of the camera module 40 sown in FIG. 9 except for the semiconductor element 14 being flip-chip mounted.

That is, after the recessed parts 45a are formed in the lead frame 45 and the metal film 15 is formed, the under-fill material 51 made of an anisotropically conductive resin is applied in the element mounting area, as shown in FIG. 11-(a). The under-fill material 15 is filled in the recessed parts 45a, which correspond to the resin bumps 16B. Then, as shown in FIG. 11-(b), the semiconductor element 14 is flip-chip mounted from above the under-fill material 51. Then, as shown in FIG. 11-(c), the molded body 12 is formed on the lead frame 45. The subsequent process is the same as the process shown in FIG. 9, and explanation thereof will be omitted.

The above-mentioned camera module 50 has the same advantage as the camera module 40. Additionally, the semiconductor element 14 can be easily mounted onto the resin bumps by forming the protruding parts by the under-fill material directly under the semiconductor element 14 so as to form the resin bumps and further performing flip chip bonding to the flat metal film 15 (bonding pads) on the lead frame 45. Since the approach of connecting the semiconductor element 14 according to the flip-chip bonding method can make the mounting area smaller than using the wire-bonding method, there is an advantage that the further miniaturization of a camera module can be attained.

As for the manufacturing method of the camera module 50, it is possible in construction to form only the resin bumps by a resin different from an encapsulation resin and the flip-chip bonding is performed in the manufacturing process so that the positions of the recessed parts (parts of a mold die corresponding to the resin bumps) of the lead frame coincide with the positions of the bumps. However, there is disadvantages in the above-mentioned method in that: 1) it is difficult to fill the resin bumps sorely when the size of the resin bumps is small; 2) there is limits in processing size and pitch of the recessed parts formed by etching the lead frame; and 3) bonding cannot be performed unless the metal bumps, which are used when flip-chip bonding, have a size larger than the depth of the recessed parts. Thus, the element mounting onto the resin bumps can be easily achieved by filling an insulating resin directly under the semiconductor element 14 including the resin bumps so as to use the insulating resin as an adhesive (an under-fill material in the case of the camera module 50), and further performing the flip-chip bonding to the flat metal film on the lead frame.

Figure 12:
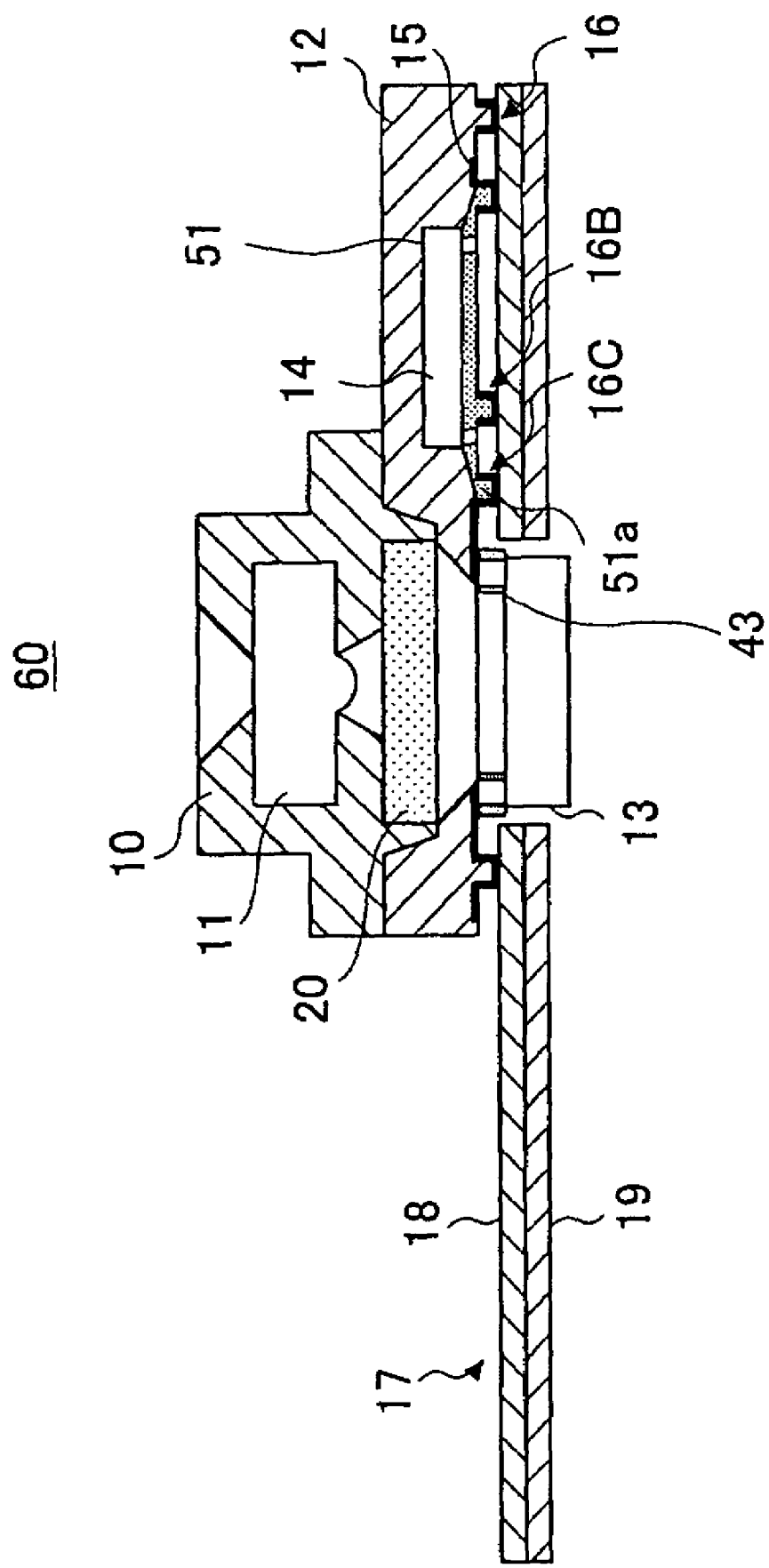
FIG. 12 is a cross-sectional view showing a variation of the camera module shown in FIG. 10.

Next, a description will be given, with reference to FIG. 12, of a variation of the above-mentioned camera module 50. FIG. 12 is a cross-sectional view showing the variation of the camera module 50. In FIG. 12, parts that are the same as the parts shown in FIG. 10 are give the same reference numerals, and descriptions thereof will be omitted.

Although the camera module 60 shown in FIG. 12 has a structure basically the same as the camera module shown in FIG. 10 except for the resin bumps being provided no only directly under the element mounting area but also in the vicinity of the resin bumps. That is, as shown in FIG. 12, resin bumps 16C are formed in the vicinity of the area (element mounting area) directly under the semiconductor element 14 or in a state where the resin bumps are bridged over the element mounting area and an area outside the element mounting area. Similar to the resin bumps 16B, the resin bumps 16C are formed using protruding parts 51a formed of the under-fill material 5.

Figure 13:
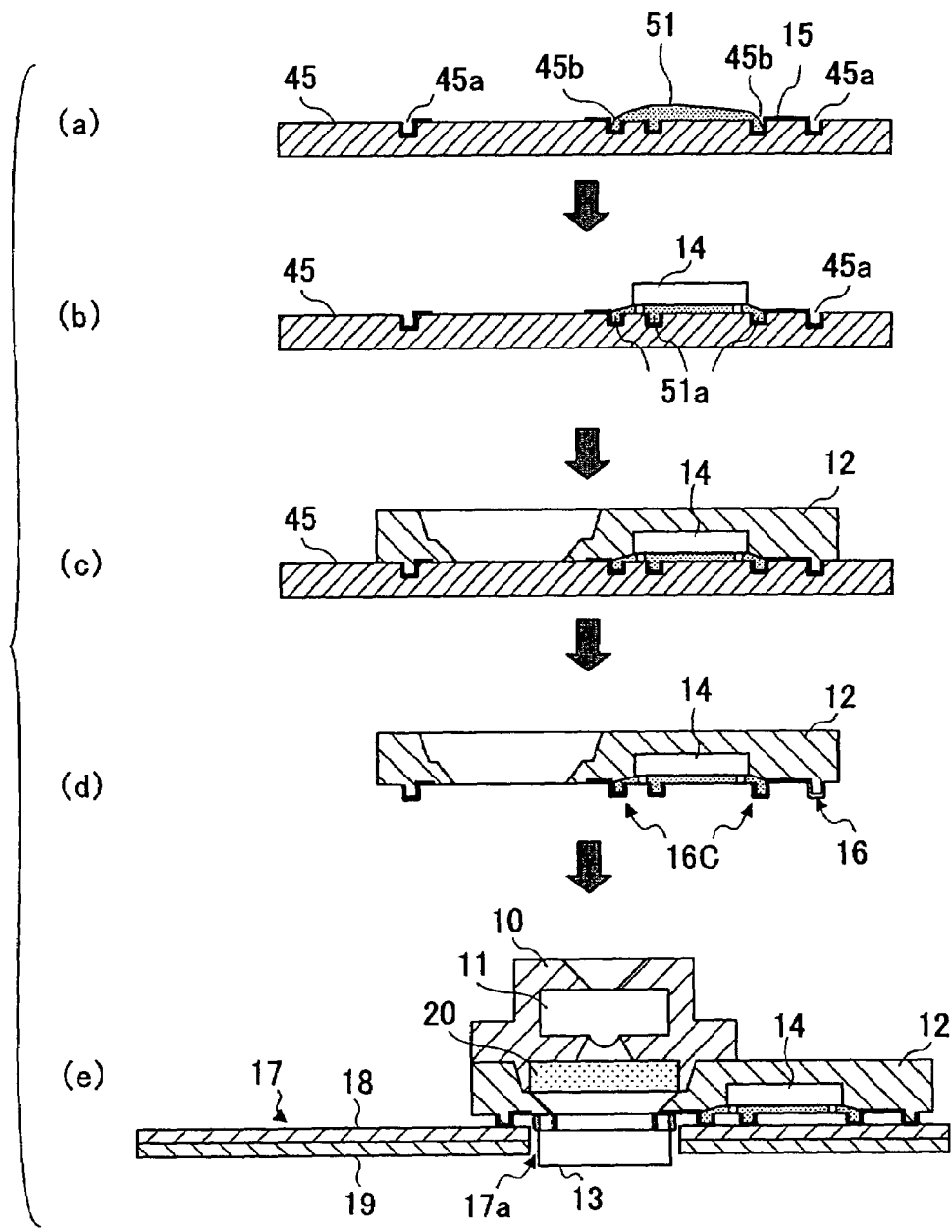
FIG. 13 is an illustration for explaining a manufacturing process of the camera module shown in FIG. 12.

FIG. 13 is an illustration for explaining a manufacturing process of the camera module 60. The manufacturing process of the camera module 60 is basically the same as the manufacturing process of the camera module 50 shown in FIG. 11 except for the recessed parts 45b being formed in the vicinity of the element mounting area of the lead frame 45. As shown in FIG. 13-(*a*), the under-fill material 51 applied to the element mounting area of the lead frame 45 flows into recessed parts 45*b* formed in the vicinity of the element mounting area. In this state, the under-fill material 51 flows into a part of the recessed parts 45*b*.

Then, when the semiconductor element 14 is places on the lead frame 45 as shown in FIG. 13-(*b*), the excessive under-fill material 51 between the semiconductor element 14 and the lead frame 45 overflows from the element mounting area and flows into the recessed parts 45*b*, and, thereby, the recessed parts 45*b* are completely filled with the under-fill material 51. That is, the recessed parts 45*b* functions as a dam where the overflowing under-fill material 51 flows in. Since an amount of overflowing under-fill material 51 is maximum at the center of each side of the element mounting area, it is preferable to provide the recessed parts 45*b* close to the center of each side of the element mounting area. Thus, the resin bumps 16C do not only function as external connection terminals but also has an effect to control the overflowing amount of the under-fill material 51 during manufacture. It should be noted that the process shown in FIG. 13 (*c*)-(*e*) is the same as that of FIG. 11(*c*)-(*e*), and descriptions thereof will be omitted.

As mentioned above, in the manufacturing process of the camera module 60, the recessed parts 45*a* exist also directly under the semiconductor element 14, and the process is performed on the assumption that the recessed parts are filled with the under-fill material. For this reason, there is an advantage that the control of the amount of application is easier than a conventional method, which makes the manufacturing process easier. In the conventional method, the resin bumps located around the semiconductor element 14 are separated away from the location to some extent so as to prevent the under-fill material 51 from being filled in the recessed parts. However, since it becomes unnecessary to separate the resin bumps from the element mounting area by forming the above-mentioned resin bumps 16C, there is a flexibility in the wiring pattern design, which provides an advantage that high-density wiring can be achieved.

Figure 14:
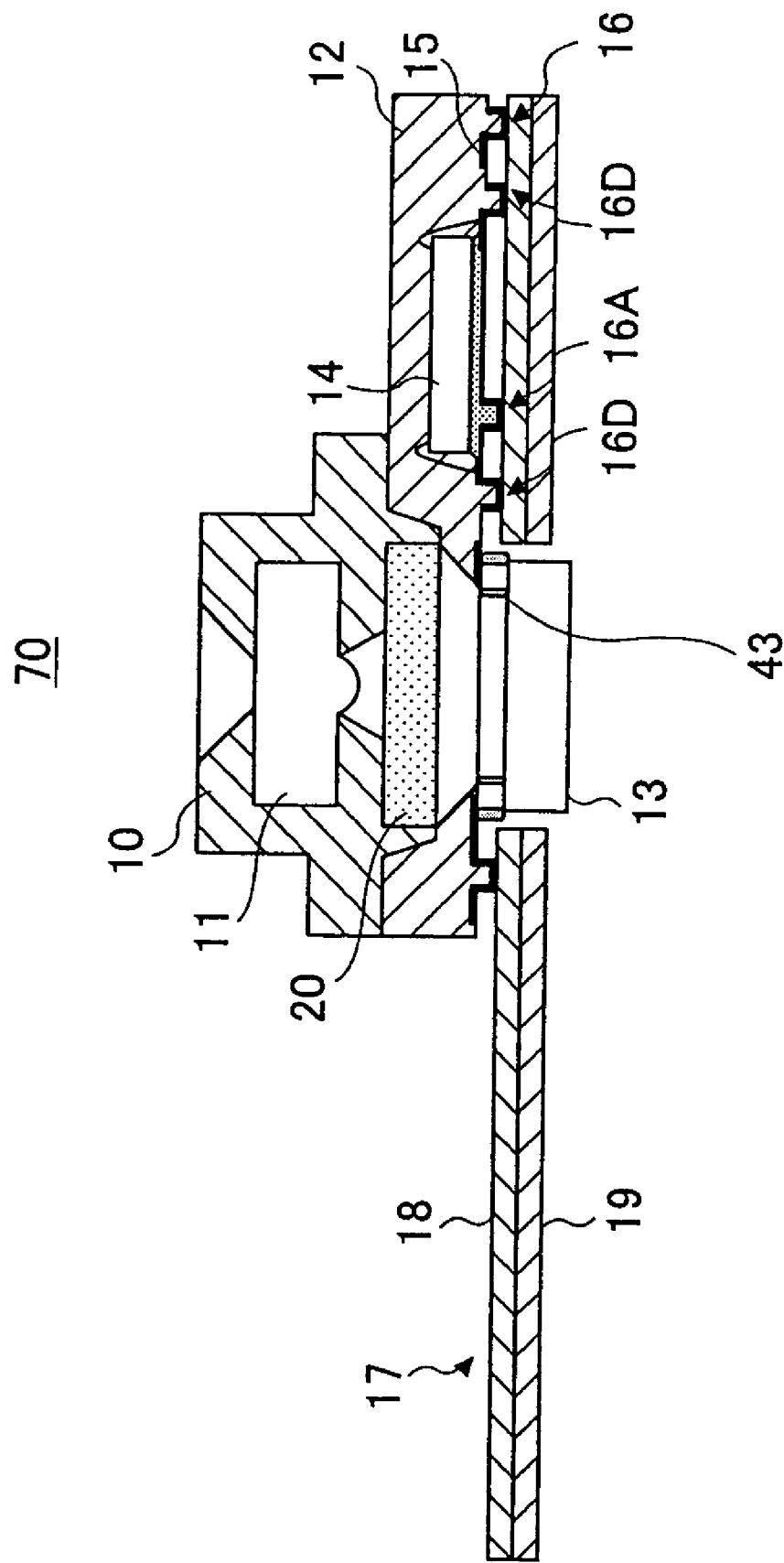
FIG. 14 is a cross-sectional view showing another variation of the camera module shown in FIG. 8.

Next, A description will be given, with reference to FIG. 14, of a variation of the camera module 40 shown in FIG. 8. FIG. 14 is a cross-sectional view of a camera module 70 which is provided with resin bumps for support. In FIG. 14, parts that are the same as the parts shown in FIG. 8 are given the same reference numerals, and descriptions thereof will be omitted.

Although the camera module 70 has a structure basically the same as the camera module 40 shown in FIG. 8 except of resin bumps 16D for support (also referred to as dummy resin bumps) being provided. (it is also called a dummy resin bump). The resin bumps 16D for support are isolated resin bumps which are not connected to the patterned wire and are arranged near the semiconductor element 14. Similar to the resin bumps 16, the resin bumps 16D for support are formed using protruding parts 12*a* (dummy protruding parts) formed of a molding encapsulation resin for forming the molded body 12.

The structure in which the resin bumps 16D for support are provided is effective when the adhesion of the metal film 15 to the element fixing resin which constitute the resin bumps 16A directly under the semiconductor element is inferior to the adhesion of the metal film 15 to the molding encapsulation resin. That is, if the adhesion of the metal film 15 to the resin protruding parts 51*a* for the resin bumps is poor, a connection strength of the resin bumps 16A to the lands of the wiring board 17 is small and, thus, exfoliation tends to occur between the resin and metal when a mechanical stress is continuously applied, which may deteriorate reliability. Thus, resin bumps 16D for support are arranged around the semiconductor element 14, and are connected to the board. By surrounding the resin bumps 16A having a small connection strength with the resin bumps 16 having a large connection strength, the resin bumps 16A can be supported at the circumference of the semiconductor element 14 so that resin bumps 16A may maintain a good connection state. For example, it is preferable to arrange the resin bumps 16D for support near the four corners of the semiconductor element 14.

Figure 15:
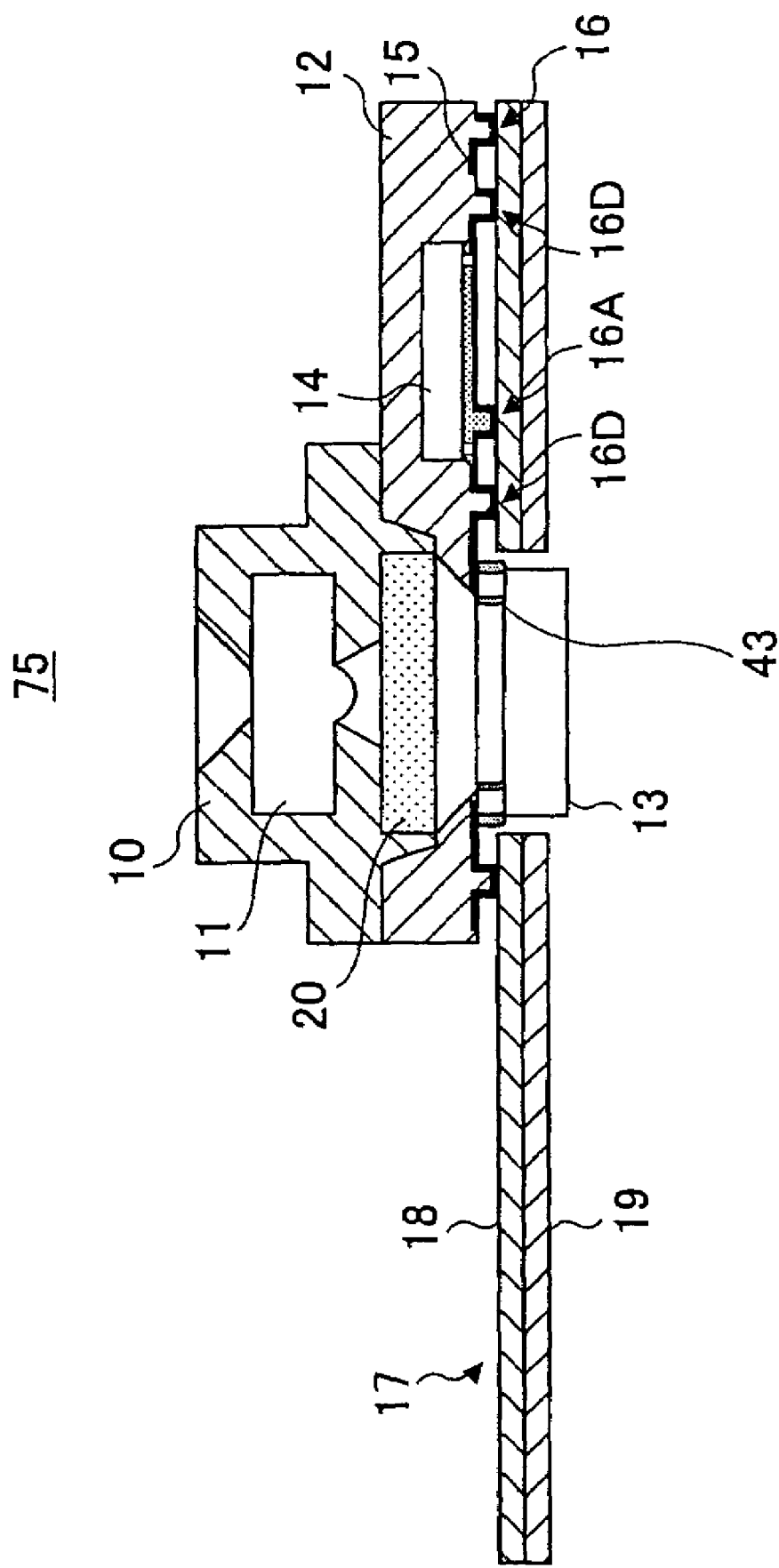
FIG. 15 is a cross-sectional view showing another variation of the camera module shown in FIG. 10.

FIG. 15 is a cross-sectional view showing an example in which the above-mentioned resin bumps 16D for support are provided to the camera module shown in FIG. 10. The camera module 75 shown in FIG. 15 has a structure basically the same as the camera module 50 shown in FIG. 10 except for the resin bumps 16D for support being provided. When the resin bumps 16B are formed using protruding parts 51*a* formed of the under-fill material 51 like the camera module 50, the adhesion between the under-fill material 51 and the metal film 15 which constitute resin bumps 16B may be inferior to the adhesion between the molding encapsulation resin and the metal film 15. In such a case, the structure provided with the resin bumps 16D for support is effective.

Figure 16:
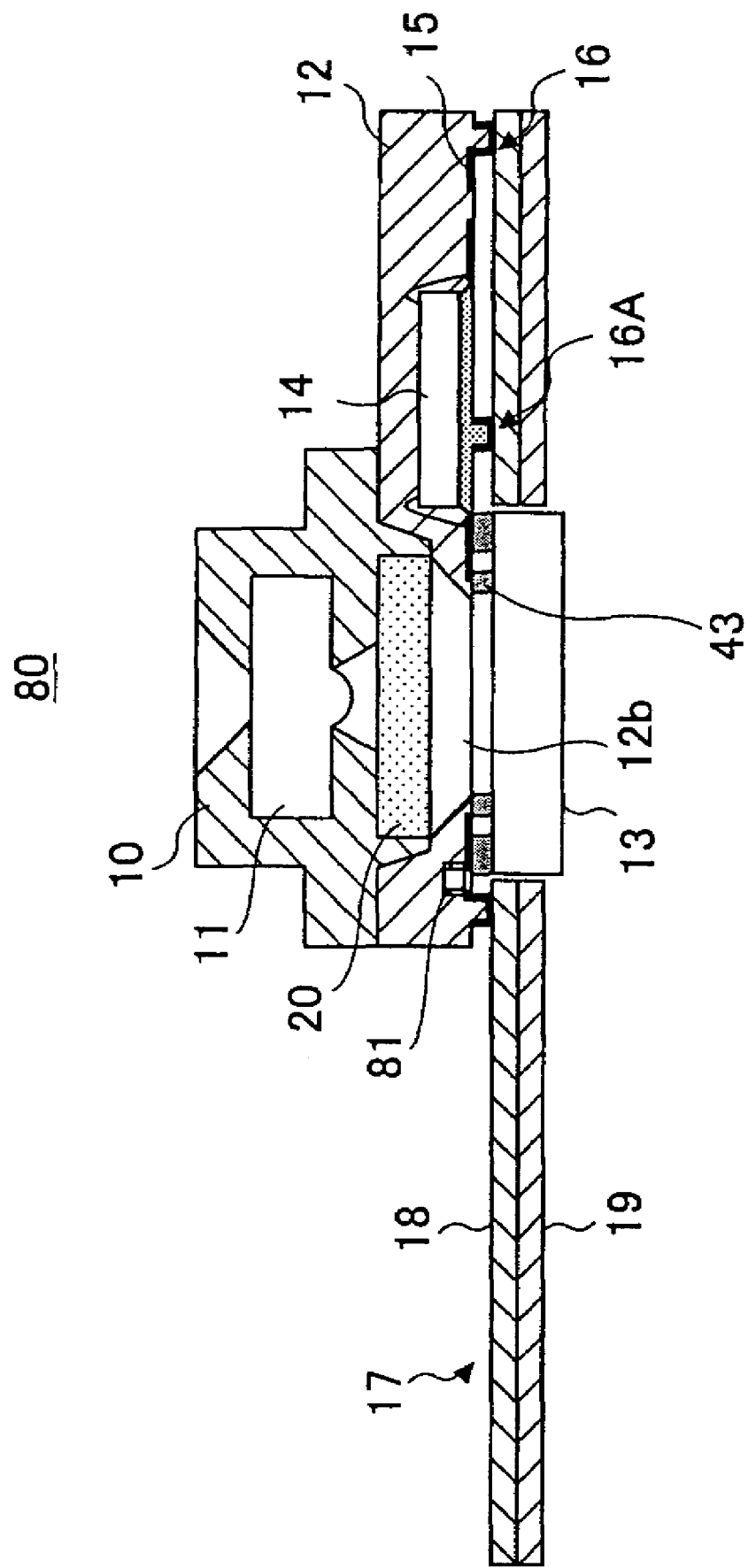
FIG. 16 is a cross-sectional view showing yet another variation of the camera module shown in FIG. 8.

Next, a description will be given, with reference to FIG. 16, of another variation of the camera module 40 shown in FIG. 8. FIG. 16 is a cross-sectional view of a camera module 80 in which a part of an imaging device and a part of a semiconductor element are overlapped with each other. In FIG. 16, parts that are the same as the parts shown in FIG. 8 are given the same reference numerals, and descriptions thereof will be omitted.

The camera module 80 has a structure basically the same as the camera module 40 shown in FIG. 8 except that a part of an imaging device and a part of a semiconductor element are arranged in an overlapping state with each other. If the size of the imaging device 13 is large and the flip-chip connected portion is away from the opening 12*b* of the molded body 12 to some extent, the molded body 12 can be miniaturized by arranging a part of the imaging device 13 and a part of the semiconductor element 14 in an overlapping state with each other. Consequently, the miniaturization of the camera module can be attained.

It should be noted that when the size of the imaging device 13 is large, a space occupied by the molded body 12 can be efficiently used by incorporating a passive element 81 such as a capacitor into the molded part above the imaging device 13.

Figure 17:
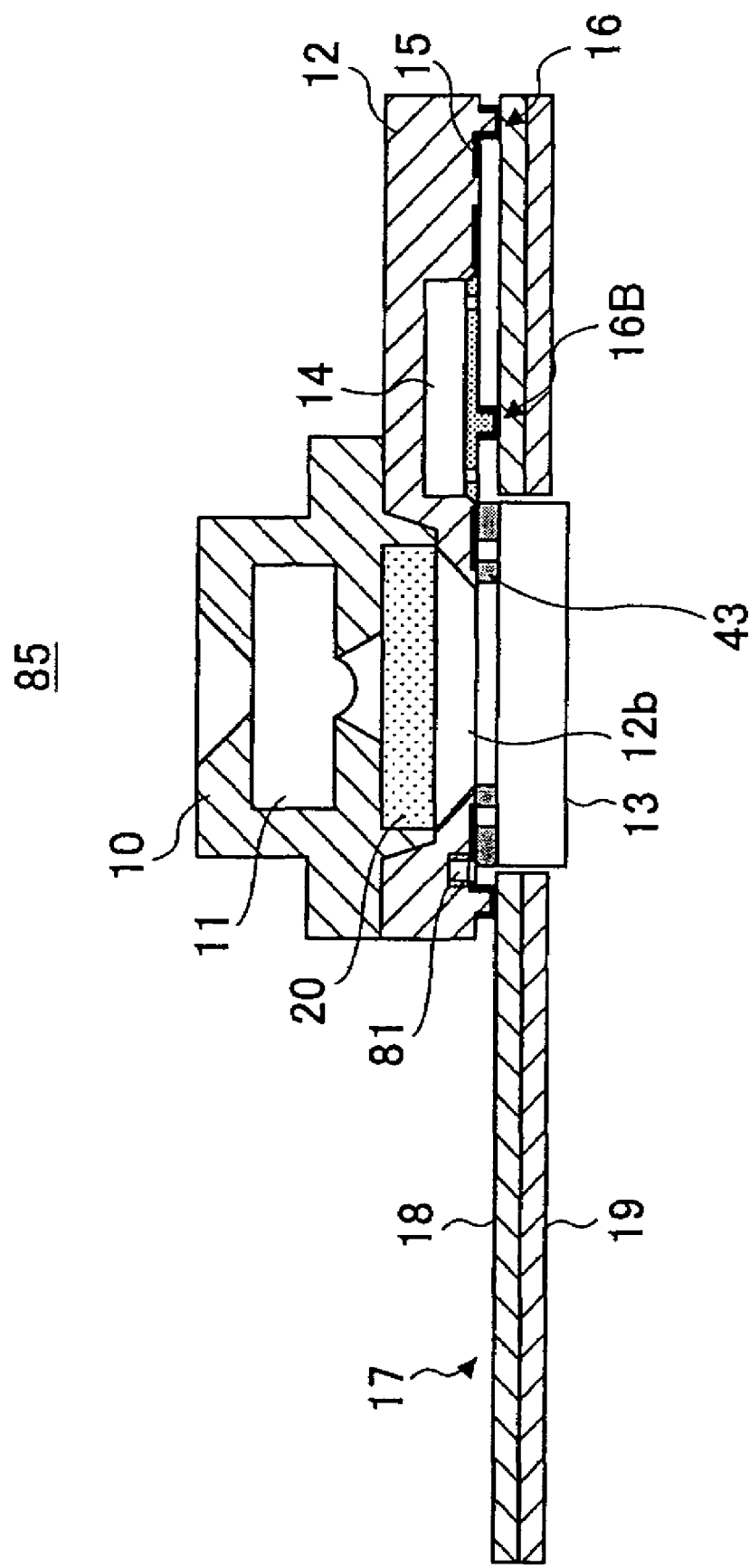
FIG. 17 is a cross-sectional view showing yet another variation of the camera module shown in FIG. 10.

FIG. 17 is a cross-sectional view showing an example in which an arrangement where a part of an imaging device and a part of a semiconductor element are overlapped with each other is applied to the camera module 50 shown in FIG. 10. In FIG. 17, parts that are the same as the parts shown in FIG. 10 are given the same reference numerals, and descriptions thereof will be omitted. A camera module 85 shown in FIG. 17 has a structure basically the same as the camera module 40 shown in FIG. 8 except that a part of an imaging device and a part of a semiconductor element are overlapped with each other. The camera module 85 has the same advantages as the camera module 80 shown in FIG. 16.

The present invention is not limited to the specifically disclosed embodiments, and variations and modifications may be made without departing from the scope of the present invention.

The present application is based on Japanese priority application No. 2002-264260 filed Sep. 10, 2002, the entire contents of which are hereby incorporated by reference.

What is claimed is:

1. A manufacturing method of a semiconductor device comprising the steps of:
   forming recessed parts in an area including an element mounting area in a mounting surface of a lead frame;
   forming a metal film on the mounting surface and inside the recessed parts of said lead frame;
   filling the recessed part formed in the element mounting area with an insulating resin;
   mounting a semiconductor element in said element mounting area of said lead frame;
   encapsulating said semiconductor element with a resin on said lead frame; and
   removing said lead frame.

2. A manufacturing method of a camera module, comprising the steps of:
   forming recessed parts in an area including an element mounting area on a mounting surface of a lead frame;
   forming a metal film on the mounting surface of said lead frame and inside the recessed parts;
   filling inside the recessed parts formed in the element mounting area with an insulating resin;
   mounting a semiconductor device in said element mounting area of said lead frame; encapsulating said semiconductor element with a mold resin on said lead frame;
   filling with the mold resin inside said recessed parts formed in an area other than said element mounting area;
   removing said lead frame from the molded body;
   flip-chip mounting an imaging device onto said metal film exposed on the mounting surface of said molded body;
   mounting said molded body to a wiring board by using said metal film which is formed on protruding parts formed by said insulating resin filled in said recessed parts and said mold resin; and
   mounting a lens holder provided with an image-pickup lens to said molded body.

3. The manufacturing method of a camera module as claimed in claim 2, wherein said insulating resin is for fixing the semiconductor element, and the step of mounting said semiconductor element includes a step of wire-bonding electrodes of said semiconductor element to said metal film.

4. The manufacturing method of a camera module as claimed in claim 2, wherein said insulating resin is an under-fill material, and the step of mounting said semiconductor element includes a step of flip-chip bonding electrodes of said semiconductor element to said metal film.

* * * * *